United States Patent [19]
Goodwin

[11] Patent Number: 5,374,841
[45] Date of Patent: Dec. 20, 1994

[54] HGCDTE S-I-S TWO COLOR INFRARED DETECTOR

[75] Inventor: Michael W. Goodwin, Garland, Tex.

[73] Assignee: Texas Instruments Incorporated, Dallas, Tex.

[21] Appl. No.: 180,005

[22] Filed: Jan. 11, 1994

Related U.S. Application Data

[63] Continuation of Ser. No. 810,757, Dec. 18, 1991, abandoned.

[51] Int. Cl.$^5$ .............. H01L 29/161; H01L 27/14; H01L 29/20
[52] U.S. Cl. .................. 257/442; 257/188; 257/440; 257/441; 257/614
[58] Field of Search ............ 257/614, 188, 442, 461, 257/441, 440

[56] References Cited

U.S. PATENT DOCUMENTS

| | | | |
|---|---|---|---|
| 4,085,500 | 4/1978 | Hager et al. | 29/589 |
| 4,524,378 | 6/1985 | Cockrum et al. | 357/71 |
| 4,549,195 | 10/1985 | Bluzer | 357/30 |
| 4,841,351 | 6/1989 | Royer | 357/30 |
| 4,956,686 | 9/1990 | Borrello et al. | 357/30 |
| 5,012,083 | 4/1991 | Chu | 250/211 J |
| 5,068,524 | 11/1991 | Elliott et al. | 250/211 J |
| 5,144,138 | 9/1992 | Kinch et al. | 250/332 |
| 5,149,956 | 9/1992 | Norton | 250/211 J |

FOREIGN PATENT DOCUMENTS

| | | |
|---|---|---|
| 0635560 | 1/1988 | Japan . |
| 1255280 | 10/1989 | Japan . |
| 2241065 | 9/1990 | Japan . |

*Primary Examiner*—William D. Larkins
*Assistant Examiner*—Valenkia Martin Wallace
*Attorney, Agent, or Firm*—Carl H. Hoel

[57] ABSTRACT

A HgCdTe S-I-S (semiconductor-insulator-semiconductor) two color infrared detector wherein the semiconductor regions are HgCdTe with different compositions for the desired spectral regions. The device is operated as a simple integrating MIS device with respect to one semiconductor. The structure can be grown by current MBE techniques and does not require any significant additional steps with regard to fabrication.

12 Claims, 1 Drawing Sheet

HGCDTE S-I-S TWO COLOR INFRARED DETECTOR

This application is a continuation, of application Ser. No. 07/810,757, filed Dec. 18, 1991, now abandoned.

BACKGROUND OF THE INVENTION

1. Field of the Invention

This invention relates to infrared detectors and, more specifically, to an infrared detector responsive to infrared energy in two different spectral bands.

2. Brief Description of the Prior Art

Infrared energy is of most interest in the spectral bands of 3 to 5 micrometers and 8 to 14 micrometers. In the present state of the art, infrared focal plane arrays are used to detect infrared radiation in only one spectral band, usually either the 3 to 5 micrometer or the 8 to 14 micrometer band. Multi-spectral band detectors offer the advantage of meeting a wide range of spectral band requirements for different tactical and strategic scenarios with the same detector. In addition, such detectors can be used for target recognition by simultaneously detecting the scene being scanned in two spectral bands and using the results to determine the temperature of the scene being scanned.

In the present state of the art, there are two principal types of HgCdTe two-color detectors, these being the MIS heterojunction detector and the triple layer heterojunction diode. Due to their unique material requirements, however, these types of detectors are generally very difficult to fabricate. It is therefore a desire of the art to overcome the material requirement inherent in the prior art HgCdTe detectors.

The HgCdTe MIS heterostructure concept has been demonstrated with molecular beam epitaxy (MBE) grown heterostructures. Devices of this type are set forth in articles of M. W. Goodwin et al., Proceedings of the IRIS Detectors Specialty Group, Monterey, Calif., 1989 and M. W. Goodwin et al, Journal of Vacuum Science Technology, A8, page 1226, 1990. The structure is basically an MIS device including a thin wide bandgap N-type layer over a thick N-type narrow bandgap layer. The thickness of the wide bandgap layer is on the order of the depletion region beneath the gate of the MIS device. With the proper dimensions of layer thickness, determined by the carrier concentration, the structure can detect radiation consistent with the wide bandgap layer or wide plus narrow bandgap layer, depending upon the appropriate voltage thereacross. The disadvantages of this structure as a two-color (two spectral band) detector are that it requires precise control of both the layer thickness and the carrier concentration and is not a true two-color detector in the sense that it detects separately narrow and wide bandgap radiation.

The triple layer heterostructure diode has also been demonstrated on a hybrid liquid phase epitaxy (LPE)-MBE grown heterostructure. Devices of this type are set forth in an article of T. N. Casselman et al., Proceedings of the IRIS Detectors Specialty Group, Gaithersburg, Md., 1990. The structure includes back-to-back diodes with the center layer composed of a short wave P-type layer. The two N-type regions of the diodes serve as the detecting layers (the wide and narrow bandgap layers). Although the wide bandgap and short wave layers are grown by LPE, the top narrow-bandgap layer must be grown by MBE due to severe grading problems with LPE. In addition, precise control of the placement of the N-P junctions is necessary for low dark currents.

In addition to HgCdTe devices, vertically stacked group III-V quantum wells have also been proposed as possible multi-spectral detectors. Devices of this type are shown in an article of B. F. Levine et al., Applied Physics Letters, volume 53, page 2196 (1988).

SUMMARY OF THE INVENTION

In accordance with the present invention, there is provided an infrared detector capable of concurrent operation in two different frequency bands, such as, for example, the 3 to 5 and the 8 to 14 micrometer bands, which is not subject to the problems of prior art devices as described above.

Briefly, there is provided a group II-VI device, preferably grown by MBE, which operates in the manner of back-to-back MIS devices, one device responsive to infrared radiation in a first frequency band and the second device responsive to infrared radiation in a second frequency band, with only one of the MIS devices being operational at any time.

The device is built in the form of a mesa with either a narrow or wide bandgap material substrate having a portion of the mesa extending therefrom and of the same material. The wide bandgap material is disposed on the side of the detector directed toward the source of radiation. The substrate is preferably formed of a group II-VI semiconductor material which is doped either N-type or P-type and preferably HgCdTe. The substrate can have a portion thereof which forms a part of the mesa and preferably has such structure. Over the substrate is an insulator layer which is preferably a portion of the mesa extending from the substrate, but need not be if the substrate does not provide a portion of the mesa structure. The insulator layer can be any insulator material but is preferably a group II-VI insulating material which can be grown over the already formed insulator layer and is preferably CdTe. Over the insulating layer is a group II-VI semiconductor material layer which is either N or P doped but of the same conductivity type as the substrate and preferably HgCdTe. This semiconductor layer is either wide or narrow bandgap and the opposite of the bandgap of the substrate. A contact is disposed on each of the substrate and the semiconductor layer. The device is preferably fabricated by MBE growth techniques.

In operation, the detector will operate in only one of the two frequency bands in which it is capable of operation at any one time. When both the substrate and the semiconductor layer are P-type group II-VI semiconductor material, the substrate is narrow bandgap and the semiconductor layer is wide bandgap, by placing a voltage across the substrate and the semiconductor layer which drives the wide bandgap region into accumulation, the wide bandgap region and the contact thereon act as a single contact. Accordingly, the wide bandgap region with the insulator layer and the narrow band gap region acts as an MIS device responsive to a first predetermined frequency band impinging upon the narrow bandgap region. Alternatively, by placing a predetermined voltage (generally of opposite polarity than in the above example) across the substrate and the semiconductor layer which is designed to drive the narrow bandgap region into accumulation, the narrow bandgap region and the contact thereon act as a single contact. When both semiconductor regions are N-type HgCdTe, for operation as a wide bandgap detector, the voltage on the narrow bandgap material contact will be negative with respect to the voltage on the wide bandgap contact and the reverse will be true for operation as a narrow bandgap detector. When both semiconductor regions are P-type HgCdTe, the voltage across the contacts will be the reverse of that above stated for N-type regions. The voltage across the contacts on the semiconductor regions when used as a wide bandgap detector is from about 0.5 to about 5 volts and the voltage across the contacts when used as a narrow bandgap detector is from about 0.5 volts to about 2 volts. Accordingly, the narrow bandgap region with the insulator layer and the wide bandgap region acts as an MIS device responsive to a second predetermined frequency band impinging upon the wide bandgap region. It can be seen that the device as described will be responsive to infrared energy in two different frequency bands, depending upon the polarity of the voltage across the wide bandgap and narrow bandgap regions. It should also be understood that the voltage polarities across the device will be reversed in the case of N-type doping as opposed to P-type doping as indicated above.

BRIEF DESCRIPTION OF THE DRAWING

The FIGURE is a schematic diagram of an infrared detector in accordance with the present invention.

DESCRIPTION OF THE PREFERRED EMBODIMENT

Figure 1:
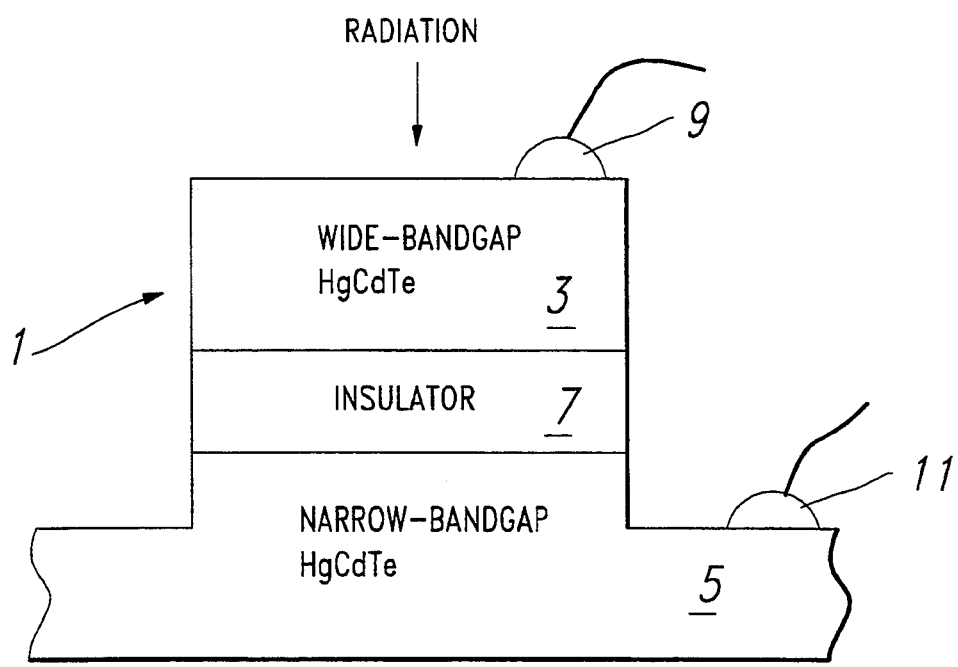

The detector device i in accordance with the present invention, as shown in the FIGURE, comprises a semiconductor-insulator-semiconductor (S-I-S) structure. The two semiconductor regions 3 and 5 serve as the detecting materials and are HgCdTe with compositions corresponding to the narrow bandgap 5 and wide bandgap 3 spectral ranges of interest. In the preferred embodiment, the band gaps are arbitrarily set to correspond to wavelengths in the 3 to 5 micrometer range and in the 8 to 14 micrometer range, it being understood that other ranges could be substituted, if desired, in standard manner. The two HgCdTe regions 3 and 5 can be either N-type or P-type, but must be of the same conductivity type. The only difference between N-type and P-type is the polarity of the voltage at which the device operates due to the heterojunction band bending. For two color detection, the wide bandgap layer is the layer which absorbs the incoming radiation first. The insulating layer 7, which is preferably CdTe, but can be any insulator including non group II–VI materials and is disposed between the semiconductor regions 3 and 5. Standard metal contacts 9 and 11 are made to both of the HgCdTe layers.

The operation of the device depends upon whether the layers are N-type or P-type and upon which spectral operating ranges are desired. The device is operated as a simple integrating MIS device with respect to the semiconductor serving as the detecting layer. Thus, for narrow bandgap detection, the narrow bandgap side is inverted and the wide bandgap side is accumulated. To inject the integrated minority carrier charge, the polarity is reversed so that the narrow bandgap side is accumulated and the wide bandgap side is inverted. This poses no problem as long as the voltage is such that the narrow bandgap side is accumulated during the inject cycle. For wide bandgap detection, the polarities are reversed from this operation. The set of operating voltages for N-type regions will generally be reversed from those for P-type regions within the constraints of the heterojunction band bending mentioned above.

Presently, all of the layers can be grown easily with current MBE technology when the insulating layer is a group II–VI material. Both N and P type HgCdTe layers as well as CdTe as the insulating layer can be so provided though the insulating layer need not be CdTe. In addition, mesa-etched structures in HgCdTe are routinely and easily provided. The only major constraint of layer thickness is the insulating layer which should be thin enough so that a reasonable capacitance between the two semiconductor regions exists. That is, the potential well capacity should be large enough to store detectable charge. For most insulating materials with dielectric constants in the range 7 to $11 \times \epsilon_0$, the thickness should be on the order of 1000 to 2000 angstroms, which is well within MBE capabilities. The widths of the semiconductors should be approximately 1/alpha, where alpha is the absorption coefficient. Thus, the layers should be approximately 5 to 10 micrometers, which is also within MBE limits.

The advantages of the above described detector are that it is a true two color detector in that, when operated in the narrow bandgap detection mode, the wide bandgap radiation will be absorbed by the wide bandgap layer and not detected and when operated in the wide bandgap detection mode, the narrow bandgap radiation will be absorbed by the narrow bandgap layer and not detected. Also, the requirements on carrier concentrations are not as severe as the MIS heterostructure concept. Further, the quantum efficiency for wide bandgap radiation will be higher than the MIS heterostructure concept due to the increased layer thickness. Also, there are no problems with bandgap grading effects and positioning of the P-N junction as with the triple layer heterojunction diode. The structure is no more complicated than the triple layer heterojunction diode and only one step (mesa etching) more than the MIS heterojunction concept. Finally, a grown insulator as opposed to a deposited insulator has lower interface states to affect device performance issues, such as 1/f noise.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modification.

I claim:

1. An infrared detector responsive to two color frequency ranges which comprises:
   (a) a substrate of one of narrow bandgap or wide bandgap group II–VI semiconductor material doped one of P-type or N-type and having an exposed surface portion;
   (b) an electrically insulating layer disposed on a portion of said surface portion;
   (c) a layer of group II–VI semiconductor material doped said one of P-type or N-type and having a bandgap the other of narrow bandgap or wide bandgap disposed over said electrically insulating layer and over and spaced from said substrate;
   (d) a first contact disposed on said substrate; and
   (e) a second contact disposed on said layer of group II–VI semiconductor material;
   (f) said substrate and first contact together acting as a single contact and said layer of group II–VI semiconductor material responsive to one of said two color frequency ranges in response to a first predetermined voltage across said first and second contacts; and (g) said layer of group II–VI semiconductor material and said second contact acting as a single contact and said substrate responsive to the other of said two color frequency ranges in response to a second predetermined voltage different from said first predetermined voltage across said first and second contacts.

2. An infrared detector as set forth in claim 1 further including a raised portion of said substrate defining a portion of said surface, said electrically insulating layer disposed on said raised portion.

3. An infrared detector as set forth in claim 1 wherein one of said substrate and said layer of semiconductor material has a bandgap responsive to wavelengths in the 3 to 5 micrometer range and the other of said substrate and said layer of semiconductor material has a bandgap responsive to wavelengths in the 8 to 14 micrometer range.

4. An infrared detector as set forth in claim 2 wherein one of said substrate and said layer of semiconductor material has a bandgap responsive to wavelengths in the 3 to 5 micrometer range and the other of said substrate and said layer of semiconductor material has a bandgap responsive to wavelengths in the 8 to 14 micrometer range.

5. An infrared detector as set forth in claim 1 wherein said electrically insulating layer has a dielectric constant in the range of 7 to $11 \times \epsilon_o$ (the permitivity constant) and a thickness of from about 1000 to about 2000 angstroms.

6. An infrared detector as set forth in claim 2 wherein said electrically insulating layer has a dielectric constant in the range of 7 to $11 \times \epsilon_o$ (the permitivity constant) and a thickness of from about 1000 to about 2000 angstroms.

7. An infrared detector as set forth in claim 3 wherein said electrically insulating layer has a dielectric constant in the range of 7 to $11 \times \epsilon_o$ (the permitivity constant) and a thickness of from about 1000 to about 2000 angstroms.

8. An infrared detector as set forth in claim 4 wherein said electrically insulating layer has a dielectric constant in the range of 7 to $11 \times \epsilon_o$ (the permitivity constant) and a thickness of from about 1000 to about 2000 angstroms.

9. An infrared detector as set forth in claim 5 wherein said layer of semiconductor material is from about 5 to about 10 micrometers thick.

10. An infrared detector as set forth in claim 6 wherein said layer of semiconductor material is from about 5 to about 10 micrometers thick.

11. An infrared detector as set forth in claim 7 wherein said layer of semiconductor material is from about 5 to about 10 micrometers thick.

12. An infrared detector as set forth in claim 8 wherein said layer of semiconductor material is from about 5 to about 10 micrometers thick.

* * * * *